US012648434B2

(12) United States Patent　　　(10) Patent No.:　US 12,648,434 B2
Liu　　　　　　　　　　　　　　　(45) Date of Patent:　Jun. 2, 2026

(54) INTERCONNECT STRUCTURE AND MANUFACTURING METHOD THEREOF

(71) Applicant: NANYA TECHNOLOGY CORPORATION, New Taipei city (TW)

(72) Inventor: Ji-Feng Liu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 396 days.

(21) Appl. No.: 18/144,999

(22) Filed: May 9, 2023

(65) Prior Publication Data

US 2024/0379561 A1　　　Nov. 14, 2024

(51) Int. Cl.
　　*H10W 20/48*　　　(2026.01)
　　*H10W 20/00*　　　(2026.01)
　　*H10W 20/41*　　　(2026.01)

(52) U.S. Cl.
　　CPC ......... *H10W 20/48* (2026.01); *H10W 20/038* (2026.01); *H10W 20/075* (2026.01); *H10W 20/092* (2026.01); *H10W 20/425* (2026.01)

(58) Field of Classification Search
　　None
　　See application file for complete search history.

(56) References Cited

U.S. PATENT DOCUMENTS

| | | | | |
|---|---|---|---|---|
| 5,510,293 A | * | 4/1996 | Numata ............ | H01L 21/02274 438/782 |
| 9,721,883 B1 | * | 8/2017 | Lai ........................ | H01L 21/187 |
| 2001/0004550 A1 | * | 6/2001 | Passemard ........ | H01L 21/76811 438/618 |
| 2002/0016085 A1 | * | 2/2002 | Huang .................. | H01L 21/314 257/E21.241 |
| 2002/0105086 A1 | * | 8/2002 | Yoshie .............. | H01L 21/02282 257/762 |
| 2002/0164891 A1 | * | 11/2002 | Gates ................ | H01L 21/02112 438/960 |
| 2005/0156285 A1 | * | 7/2005 | Gates ..................... | C23C 16/56 257/632 |
| 2006/0128167 A1 | * | 6/2006 | Nakata .............. | H01L 21/02304 438/795 |
| 2006/0252252 A1 | * | 11/2006 | Zhu ........................ | C23C 18/40 257/E21.174 |
| 2022/0310441 A1 | * | 9/2022 | Su ..................... | H01L 23/53295 |

* cited by examiner

*Primary Examiner* — Feifei Yeung Lopez
(74) *Attorney, Agent, or Firm* — CKC & Partners Co., LLC

(57)　　　　　ABSTRACT

An interconnect structure includes a barrier layer, an oxide glue layer, and an ultra low-k dielectric layer. The oxide glue layer is located on the barrier layer. The ultra low-k dielectric layer is located on the oxide glue layer, wherein the oxide glue layer is located between the barrier layer and the ultra low-k dielectric layer, and the ultra low-k dielectric layer has porosity less than 40%.

16 Claims, 7 Drawing Sheets

100d

100

100a

| Film Quality Comparison | ULK | BD |
|---|---|---|
| Dielectric constant (k) | <2.5 | <3.0 |
| Porosity (%) | < 40 | <10 |
| Pore arrangement | Order | Disorder |
| Pore distribution | Uniform | Non-uniform |
| Stress induced by CMP | Release | Enhance |

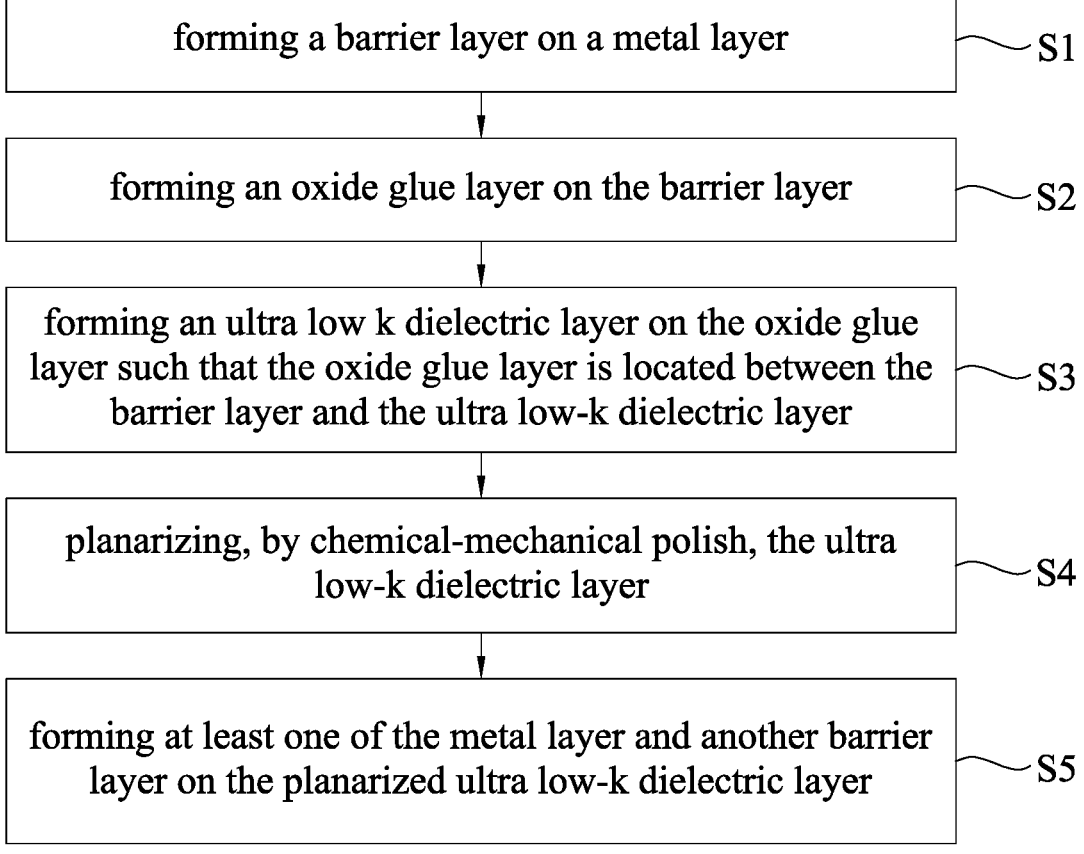

| | |
|---|---|
| forming a barrier layer on a metal layer | S1 |
| forming an oxide glue layer on the barrier layer | S2 |
| forming an ultra low k dielectric layer on the oxide glue layer such that the oxide glue layer is located between the barrier layer and the ultra low-k dielectric layer | S3 |
| planarizing, by chemical-mechanical polish, the ultra low-k dielectric layer | S4 |
| forming at least one of the metal layer and another barrier layer on the planarized ultra low-k dielectric layer | S5 |

Fig. 7

INTERCONNECT STRUCTURE AND MANUFACTURING METHOD THEREOF

BACKGROUND

Field of Invention

The present disclosure relates to an interconnect structure and a manufacturing method of the interconnect structure.

Description of Related Art

The manufacturing process of a semiconductor integrated circuit (IC) includes a front-end-of-line (FEOL) process, a middle-end-of-line (MEOL) process, and a back-end-of-line (BEOL) process. The front-end process includes wafer preparation, isolation, well formation, gate patterning, spacers, extension and source/drain implantation, silicide formation, and dual stress pad formation. The middle process includes gate contact formation. The back-end process includes a series of wafer processing steps to interconnect semiconductor components produced during the front-end process and the middle-end process. In addition, successful manufacturing of qualified semiconductor wafer products requires consideration of the interaction between materials and processes.

As dimension for a semiconductor device is shrunk, resistive-capacitive (RC) delay performance associated with dielectric layers in a traditional interconnect structure including the stack of a low-k barrier and a black diamond cannot fulfill the needs of next generation product. Although an ultra low-k (ULK) layer having a high porosity and a low-k dielectric constant may be used in the interconnect structure to improve RC delay performance, the interface adhesion of the ULK layer is worse, which would cause film delamination during package. In addition, even if no porogen is added at initial step of forming the ULK layer to lower the porosity of the ULK layer, the interconnect structure still show delamination due to general precursor of the ULK layer having poor adhesion intrinsically.

SUMMARY

One aspect of the present disclosure provides an interconnect structure.

According to some embodiments of the present disclosure, an interconnect structure includes a barrier layer, an oxide glue layer, and an ultra low-k dielectric layer. The oxide glue layer is located on the barrier layer. The ultra low-k dielectric layer is located on the oxide glue layer, wherein the oxide glue layer is located between the barrier layer and the ultra low-k dielectric layer, and the ultra low-k dielectric layer has porosity less than 40%.

In some embodiments, the oxide glue layer is in contact with a top surface of the barrier layer and a bottom surface of the ultra low-k dielectric layer.

In some embodiments, the porosity of the oxide glue layer is greater than 10%.

In some embodiments, the oxide glue layer is formed by a precursor including tetraethyl orthosilicate (TEOS).

In some embodiments, the ultra low-k dielectric layer is formed by a precursor different from TEOS.

In some embodiments, the ultra low-k dielectric layer includes a plurality pores that are arranged in order and are arranged in a uniform distribution.

In some embodiments, a material of the oxide glue layer and a material of the ultra low-k dielectric layer include silicon oxide.

In some embodiments, the ultra low-k dielectric layer has a dielectric constant less than a dielectric constant of the barrier layer.

In some embodiments, the dielectric constant of the ultra low-k dielectric layer is less than 2.5.

In some embodiments, the dielectric constant of the barrier layer is less than 4.0.

In some embodiments, a material of the barrier layer includes amorphous silicon carbide (a-SiC).

In some embodiments, the interconnect structure further includes a metal layer in contact with a top surface of the ultra low-k dielectric layer.

In some embodiments, the interconnect structure further includes another barrier layer in contact with a top surface of the ultra low-k dielectric layer.

In some embodiments, the interconnect structure further includes a metal layer, wherein the barrier layer is located on the metal layer.

In some embodiments, the interconnect structure further includes a cap layer located on the ultra low-k dielectric layer.

Another aspect of the present disclosure provides a manufacturing method of an interconnect structure.

According to some embodiments of the present disclosure, a manufacturing method of an interconnect structure includes forming a barrier layer on a metal layer; forming an oxide glue layer on the barrier layer; and forming an ultra low-k dielectric layer on the oxide glue layer such that the oxide glue layer is located between the barrier layer and the ultra low-k dielectric layer, wherein the ultra low-k dielectric layer has a porosity less than 40%.

In some embodiments, forming the oxide glue layer on the barrier layer includes using tetraethyl orthosilicate (TEOS) as a precursor to form the oxide glue layer.

In some embodiments, the oxide glue layer and the ultra low-k dielectric layer are respectively formed by a first precursor and a second precursor that is different from the first precursor.

In some embodiments, forming the ultra low-k dielectric layer on the oxide glue layer includes depositing a dielectric material with a porogen on the oxide glue layer; and curing, by UV light, the dielectric material to remove the porogen.

In some embodiments, the manufacturing method of the interconnect structure further includes planarizing, by chemical-mechanical polish, the ultra low-k dielectric layer; and forming at least one of the metal layer and another barrier layer on the planarized ultra low-k dielectric layer.

In the aforementioned embodiments of the present disclosure, since the interconnect structure has the oxide glue layer between the barrier layer and the ultra low-k (ULK) dielectric layer, the oxide glue layer can provide interface adhesion to the underlying barrier layer and the overlying ultra low-k dielectric layer. As a result, film delamination between the ultra low-k dielectric layer and the barrier layer does not occur during package, and no crack during a chemical-mechanical polish (CMP) process performed on the interconnect structure. Furthermore, the ultra low-k dielectric layer can have a high porosity a low-k dielectric constant to improve the resistive-capacitive (RC) delay performance of a semiconductor device that includes the interconnect structure. In addition, the ultra low-k dielectric layer has ordered pore arrangement and uniform pore distribution due to porogen self-assembly and cross-link, and thus the ultra low-k dielectric layer can have good mechanical properties even though its high porosity. Accordingly, a cap layer on the ultra low-k dielectric layer may be omitted because the ultra low-k dielectric layer can release stress induced by CMP to resist film crack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a film quality comparison chart between a ultra low-k dielectric layer of one embodiment of the present disclosure and a traditional black diamond.

FIG. 7 is a flow chart of a manufacturing method of an interconnect structure according to one embodiment of the present disclosure.

DETAILED DESCRIPTION

Figure 1:
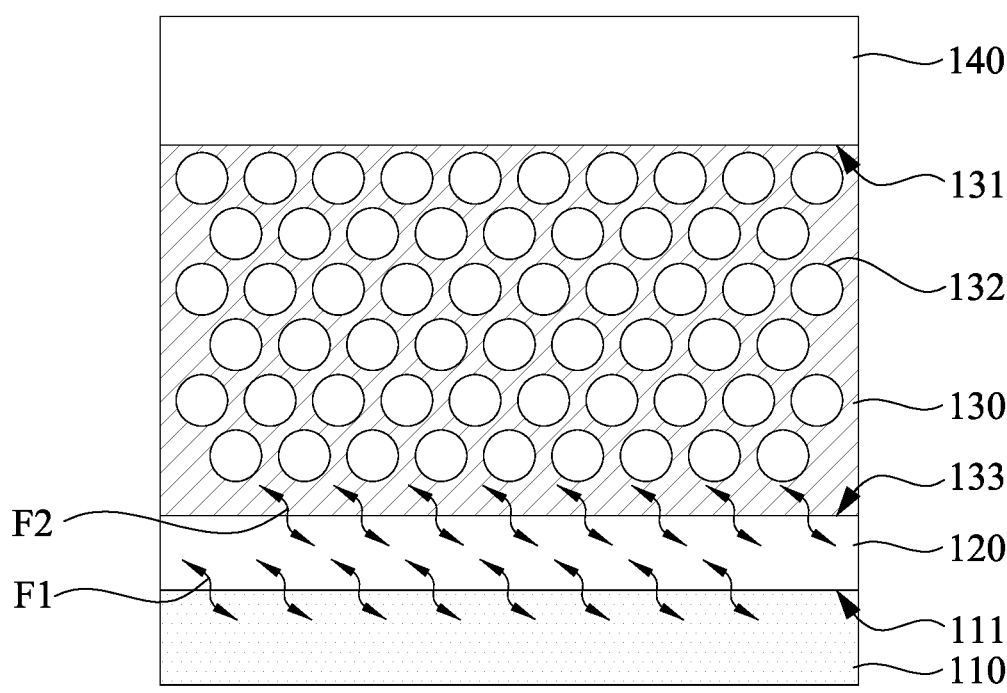
FIG. 1 is a cross-sectional view of an interconnect structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of an interconnect structure 100 according to one embodiment of the present disclosure. As shown in FIG. 1, the interconnect structure 100 includes a barrier layer 110, an oxide glue layer 120, and an ultra low-k (ULK) dielectric layer 130. In this embodiment, the interconnect structure 100 further includes a cap layer 140 located on the ultra low-k dielectric layer 130. The oxide glue layer 120 is located on the barrier layer 110. The ultra low-k dielectric layer 130 is located on the oxide glue layer 120. In other words, the oxide glue layer 120 is located between the barrier layer 110 and the ultra low-k dielectric layer 130. The oxide glue layer 120 is configured to provide interface adhesion (e.g., adhesion force F1 and adhesion force F2) to the barrier layer 110 and the ultra low-k dielectric layer 130, thereby preventing the barrier layer 110 and the ultra low-k dielectric layer 130 from delamination. In more detail, the oxide glue layer 120 is in contact with a top surface 111 of the barrier layer 110 and a bottom surface 133 of the ultra low-k dielectric layer 130.

The interconnect structure 100 may be applied to a semiconductor device, such as a memory device having a logic region, but the present disclosure is not limited in this regard. The interconnect structure 100 may be located between two metal layers (e.g., copper layers), two dielectric layers, or one metal layer and one dielectric layer, as deemed necessary by the design of the semiconductor device.

In some embodiments, the ultra low-k dielectric layer 130 has porosity less than 40% and at least greater than 10%. The ultra low-k dielectric layer 130 includes a plurality pores 132 that are arranged in order and are arranged in a uniform distribution due to porogen self-assembly and cross-link. The ultra low-k dielectric layer 130 has a dielectric constant less than the dielectric constant of the barrier layer 110. For example, the dielectric constant of the ultra low-k dielectric layer 130 is less than 2.5, and the dielectric constant of the barrier layer 110 is less than 4.0.

In some embodiments, the oxide glue layer 120 is formed by a precursor including tetraethyl orthosilicate (TEOS), and thus the oxide glue layer 120 can enhance interface adhesion to the barrier layer 110 and the ultra low-k dielectric layer 130. The ultra low-k dielectric layer 130 may be formed by a precursor different from TEOS, such as silane ($SiH_4$) or silicon tetrachloride ($SiCl_4$). Moreover, the material of the oxide glue layer 120, the material of the ultra low-k dielectric layer 130, and the material of the cap layer 140 include oxide, such as silicon oxide ($SiO2$). In addition, the material of the barrier layer 110 may include amorphous silicon carbide (a-SiC).

Specifically, since the interconnect structure 100 has the oxide glue layer 120 between the barrier layer 110 and the ultra low-k (ULK) dielectric layer 130, the oxide glue layer 120 can provide interface adhesion to the underlying barrier layer 110 and the overlying ultra low-k dielectric layer 130. As a result, film delamination between the ultra low-k dielectric layer 130 and the barrier layer 110 does not occur during package, and no crack during a chemical-mechanical polish (CMP) process performed on a semiconductor device having the interconnect structure 100. Accordingly, the interconnect structure 100 having the oxide glue layer 120 can improve product yield and reliability. Furthermore, the ultra low-k dielectric layer 130 can have a high porosity a low-k dielectric constant to improve the resistive-capacitive (RC) delay performance of a semiconductor device that includes the interconnect structure 100.

It is to be noted that the connection relationships, the materials, and the advantages of the elements described above will not be repeated in the following description. In the following description, other types of interconnect structures will be explained.

Figure 2:
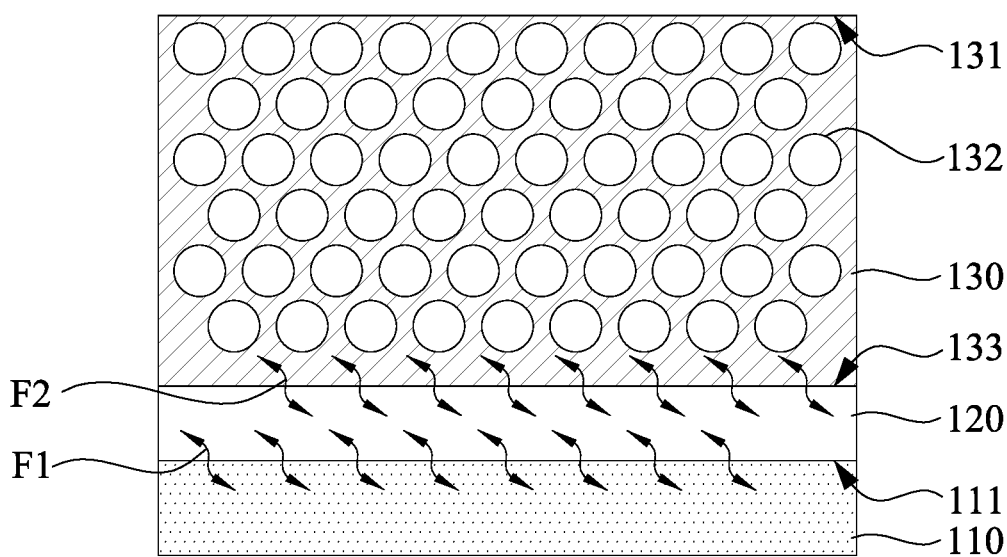
FIG. 2 is a cross-sectional view of an interconnect structure according to another embodiment of the present disclosure.

FIG. 2 is a cross-sectional view of an interconnect structure 100a according to another embodiment of the present disclosure. The interconnect structure 100a includes the barrier layer 110, the oxide glue layer 120, and the ultra low-k (ULK) dielectric layer 130. The difference between this embodiment and the embodiment of FIG. 1 is that the interconnect structure 100a of FIG. 2 has no cap layer 140

(see FIG. 1) on the ultra low-k dielectric layer 130. In other words, a top surface 131 of the ultra low-k dielectric layer 130 is free from coverage by the cap layer 140.

The ultra low-k dielectric layer 130 has ordered pore arrangement and uniform pore distribution due to porogen self-assembly and cross-link, and thus the ultra low-k dielectric layer 130 can have good mechanical properties even though its high porosity. Accordingly, the cap layer 140 (see FIG. 1) on the ultra low-k dielectric layer 130 can be omitted because the ultra low-k dielectric layer 130 can release stress induced by CMP to resist film crack.

FIG. 3 is a film quality comparison chart between the ultra low-k dielectric (ULK) layer 130 of one embodiment of the present disclosure and a traditional black diamond (BD). The ultra low-k dielectric layer 130 shown in FIGS. 1 and 2 can replace the black diamond in the technical field of interconnect structure. The dielectric constant of the ultra low-k dielectric layer 130 is less than 2.5, while the dielectric constant of the black diamond is less than 3.0. The dielectric constant of the ultra low-k dielectric layer 130 may be less than the dielectric constant of the black diamond. The porosity of the ultra low-k dielectric layer 130 is less than 40%, while the porosity of the black diamond is less than 10%. The porosity of the ultra low-k dielectric layer 130 may be greater than the porosity of the black diamond. The pore arrangement of the ultra low-k dielectric layer 130 is order, while the pore arrangement of the black diamond is disorder. The pore distribution of the ultra low-k dielectric layer 130 is uniform, while the pore distribution of the black diamond is non-uniform. In addition, the ultra low-k dielectric layer 130 can release stress induced by CMP, while the black diamond enhances stress induced by CMP.

Figure 4:
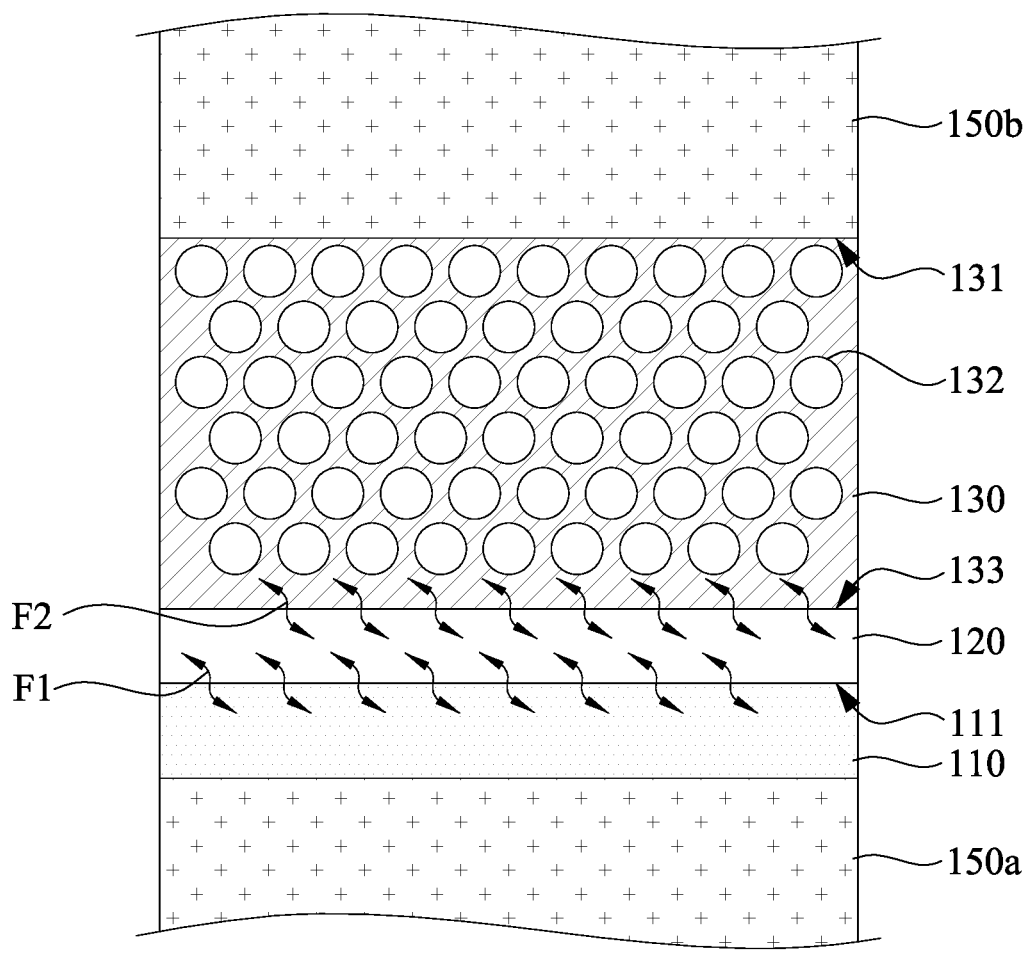
FIG. 4 is a cross-sectional view of an interconnect structure according to still another embodiment of the present disclosure.

FIG. 4 is a cross-sectional view of an interconnect structure 100b according to still another embodiment of the present disclosure. The interconnect structure 100b includes the barrier layer 110, the oxide glue layer 120, and the ultra low-k (ULK) dielectric layer 130. The difference between this embodiment and the embodiment of FIG. 2 is that the interconnect structure 100b further includes two metal layers 150a and 150b. Each of the two metal layers 150a and 150b may be a copper layer for transmitting electrical signals. The barrier layer 110 is located on the metal layer 150a. That is, the metal layer 150a is below the barrier layer 110. In some embodiments, the metal layer 150b is in contact with the top surface 131 of the ultra low-k dielectric layer 130.

Figure 5:
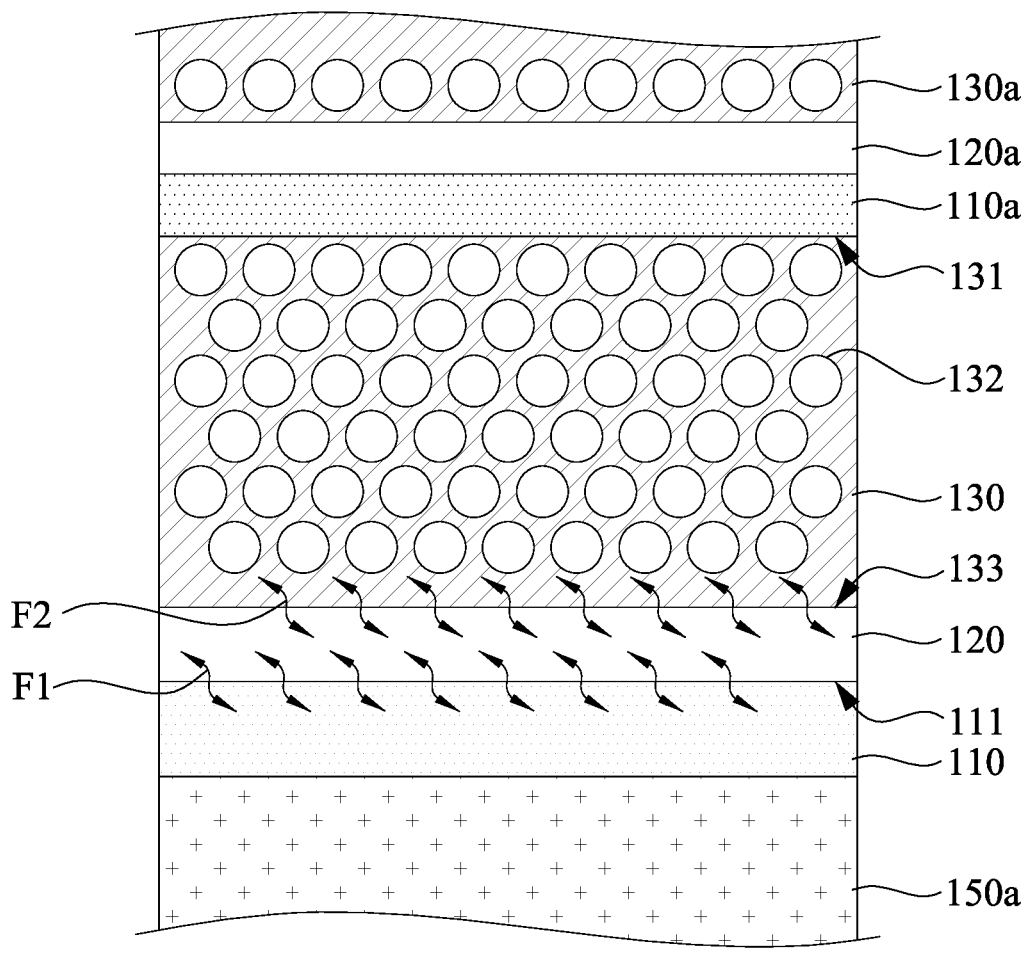
FIG. 5 is a cross-sectional view of an interconnect structure according to yet another embodiment of the present disclosure.

FIG. 5 is a cross-sectional view of an interconnect structure 100c according to yet another embodiment of the present disclosure. The interconnect structure 100c includes the barrier layer 110, the oxide glue layer 120, and the ultra low-k (ULK) dielectric layer 130. The difference between this embodiment and the embodiment of FIG. 4 is that the interconnect structure 100c further includes another barrier layer 110a, another oxide glue layer 120a, and another ultra low-k dielectric layer 130a that are sequentially stacked on the ultra low-k dielectric layer 130. In some embodiments, the barrier layer 110a is in contact with the top surface 131 of the ultra low-k dielectric layer 130.

Figure 6:
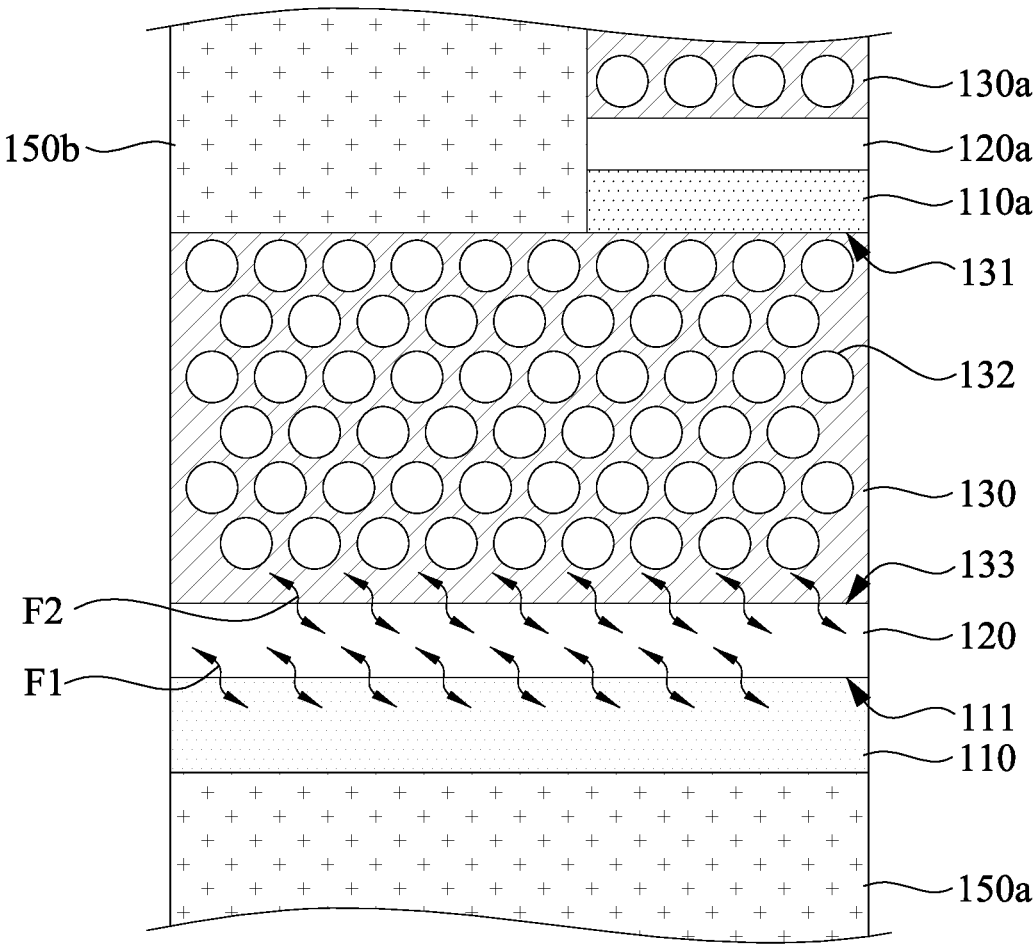
FIG. 6 is a cross-sectional view of an interconnect structure according to one embodiment of the present disclosure.

FIG. 6 is a cross-sectional view of an interconnect structure 100d according to one embodiment of the present disclosure. The interconnect structure 100d includes the barrier layer 110, the oxide glue layer 120, and the ultra low-k (ULK) dielectric layer 130. The difference between this embodiment and each of the embodiments of FIGS. 4 and 5 is that the interconnect structure 100d includes the barrier layer 110a, the oxide glue layer 120a, the ultra low-k dielectric layer 130a, and the metal layer 150b. The metal layer 150b and the barrier layer 110a are in contact with the top surface 131 of the ultra low-k dielectric layer 130. Moreover, the sidewall of the metal layer 150b is in contact with the barrier layer 110a, the oxide glue layer 120a, and the ultra low-k dielectric layer 130a.

FIG. 7 is a flow chart of a manufacturing method of an interconnect structure according to one embodiment of the present disclosure. The manufacturing method of the interconnect structure includes the following steps. In step S1, a barrier layer is formed on a metal layer. Thereafter, in step S2, an oxide glue layer is formed on the barrier layer. Afterwards, in step S3, an ultra low-k dielectric layer is formed on the oxide glue layer such that the oxide glue layer is located between the barrier layer and the ultra low-k dielectric layer. Next, in step S4, the ultra low-k dielectric layer is planarized by chemical-mechanical polish (CMP). Subsequently, in step S5, at least one of the metal layer and another barrier layer is formed on the planarized ultra low-k dielectric layer. The manufacturing method of the interconnect structure is not limited to the above steps S1 to S5. For example, in some embodiments, the manufacturing method can further include other steps between two of the above steps, or can further include other steps before step S1 and after step S5.

In the following description, the aforementioned steps of the manufacturing method of the interconnect structure will be explained in detail.

As shown in FIG. 6, the barrier layer 110 is formed on the metal layer 150a. Thereafter, the oxide glue layer 120 is formed on the barrier layer 110. The formation of the oxide glue layer 120 includes using tetraethyl orthosilicate (TEOS) as a precursor to form the oxide glue layer 120. After forming the oxide glue layer 120, the ultra low-k dielectric layer 130 is formed on the oxide glue layer 120 such that the oxide glue layer 120 is located between the barrier layer 110 and the ultra low-k dielectric layer 130. The ultra low-k dielectric layer 130 has a porosity less than 40%. Furthermore, the oxide glue layer 120 and the ultra low-k dielectric layer 130 are respectively formed by a first precursor (e.g., TEOS) and a second precursor (e.g., SiCl4) that is different from the first precursor. The formation of the ultra low-k dielectric layer 130 on the oxide glue layer 120 may include depositing a dielectric material with a porogen on the oxide glue layer 120, and then curing the dielectric material to remove the porogen by UV light. Thereafter, the ultra low-k dielectric layer 130 may be planarized by chemical-mechanical polish (CMP), and at least one of the metal layer 150b and the barrier layer 110a may be formed on the planarized ultra low-k dielectric layer 130.

Through some or all of the aforementioned steps, the interconnect structures 100, 100a, 100b, 100c, and 100d respectively in FIGS. 1, 2, 4, 5, and 6 can be obtained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:

a barrier layer;

an oxide glue layer located on the barrier layer;

an ultra low-k dielectric layer located on the oxide glue layer, wherein the oxide glue layer is located between the barrier layer and the ultra low-k dielectric layer, and the ultra low-k dielectric layer has a porosity less than 40%, and the oxide glue layer is in contact with a top surface of the barrier layer and a bottom surface of the ultra low-k dielectric layer;

a metal layer in contact with a top surface of the ultra low-k dielectric layer; and another barrier layer in contact with said top surface of the ultra low-k dielectric layer, wherein a sidewall of the another barrier layer is in contact with a lower portion of a sidewall of the metal layer.

2. The interconnect structure of claim 1, wherein the porosity of the oxide glue layer is greater than 10%.

3. The interconnect structure of claim 1, wherein the oxide glue layer is formed by a precursor comprising tetraethyl orthosilicate (TEOS).

4. The interconnect structure of claim 1, wherein the ultra low-k dielectric layer is formed by a precursor different from TEOS.

5. The interconnect structure of claim 1, wherein the ultra low-k dielectric layer comprises a plurality pores that are arranged in order and are arranged in a uniform distribution.

6. The interconnect structure of claim 1, wherein a material of the oxide glue layer and a material of the ultra low-k dielectric layer comprise silicon oxide.

7. The interconnect structure of claim 1, wherein the ultra low-k dielectric layer has a dielectric constant less than a dielectric constant of the barrier layer.

8. The interconnect structure of claim 7, wherein the dielectric constant of the ultra low-k dielectric layer is less than 2.5.

9. The interconnect structure of claim 7, wherein the dielectric constant of the barrier layer is less than 4.0.

10. The interconnect structure of claim 1, wherein a material of the barrier layer comprises amorphous silicon carbide (a-SiC).

11. The interconnect structure of claim 1, further comprising:

another metal layer, wherein the barrier layer is located on the another metal layer.

12. The interconnect structure of claim 1, further comprising:

a cap layer located on the ultra low-k dielectric layer.

13. A manufacturing method of an interconnect structure, comprising:

forming a barrier layer on a metal layer;

forming an oxide glue layer on the barrier layer;

forming an ultra low-k dielectric layer on the oxide glue layer such that the oxide glue layer is located between the barrier layer and the ultra low-k dielectric layer, wherein the ultra low-k dielectric layer has a porosity less than 40%;

planarizing, by chemical-mechanical polish, the ultra low-k dielectric layer;

forming another metal layer in contact with a top surface of the ultra low-k dielectric layer; and forming another barrier layer in contact with said top surface of the ultra low-k dielectric layer, wherein a sidewall of the another barrier layer is in contact with a lower portion of a sidewall of the another metal layer.

14. The manufacturing method of the interconnect structure of claim 13, wherein forming the oxide glue layer on the barrier layer comprises:

using tetraethyl orthosilicate (TEOS) as a precursor to form the oxide glue layer.

15. The manufacturing method of the interconnect structure of claim 13, wherein the oxide glue layer and the ultra low-k dielectric layer are respectively formed by a first precursor and a second precursor that is different from the first precursor.

16. The manufacturing method of the interconnect structure of claim 13, wherein forming the ultra low-k dielectric layer on the oxide glue layer comprises:

depositing a dielectric material with a porogen on the oxide glue layer; and curing, by UV light, the dielectric material to remove the porogen.

* * * * *